(12) United States Patent
Ma et al.

(10) Patent No.: US 9,842,963 B2
(45) Date of Patent: Dec. 12, 2017

(54) GAN-BASED LED EPITAXIAL STRUCTURE AND PREPARATION METHOD THEREOF

(71) Applicant: ENRAYTEK OPTOELECTRONICS CO., LTD., Shanghai (CN)

(72) Inventors: Houyong Ma, Shanghai (CN); Qiming Li, Shanghai (CN); Yu Zhang, Shanghai (CN); Huiwen Xu, Shanghai (CN)

(73) Assignee: ENRAYTEK OPTOELECTRONICS CO., LTD., Shenghai (CN)

( * ) Notice: Subject to any disclaimer, the term of this patent is extended or adjusted under 35 U.S.C. 154(b) by 23 days.

(21) Appl. No.: 15/074,736

(22) Filed: Mar. 18, 2016

(65) Prior Publication Data

US 2016/0276529 A1   Sep. 22, 2016

(30) Foreign Application Priority Data

Mar. 20, 2015   (CN) .......................... 2015 1 01259535

(51) Int. Cl.
*H01L 33/32*    (2010.01)
*H01L 33/12*    (2010.01)
(Continued)

(52) U.S. Cl.
CPC .......... *H01L 33/06* (2013.01); *H01L 21/0254* (2013.01); *H01L 21/02458* (2013.01);
(Continued)

(58) Field of Classification Search
CPC ......... H01L 33/32; H01L 33/06; H01L 33/04; H01L 33/12; H01L 333/32; H01L 333/06; H01L 333/04; H01L 333/0254; H01L 333/02458; H01L 333/0075; H01L 333/007; H01L 33/0254; H01L 33/02458; H01L 33/0075; H01L 33/007
See application file for complete search history.

(56) References Cited

U.S. PATENT DOCUMENTS 6,603,147 B1 *   8/2003   Hashimoto ............. H01L 33/32
                                                          257/103
6,606,147 B2 *   8/2003   Chiu ....................... G01B 11/18
                                                          356/32

(Continued)

*Primary Examiner* — Marvin Payen
*Assistant Examiner* — Jeremy Joy
(74) *Attorney, Agent, or Firm* — Oliff PLC (57) ABSTRACT

A GaN-based LED epitaxial structure comprises a non-doped GaN buffer layer, an undoped GaN layer, an N-type GaN layer, an InGaN/GaN superlattice quantum well structure, a multiple quantum well luminous layer structure, an AlGaN layer, a low-temperature P-type layer, a P-type electron blocking layer and a P-type GaN layer which are sequentially stacked, wherein the non-doped GaN buffer layer comprises a sandwich structure consisting of a GaN layer, an AlGaN layer and a GaN layer which are sequentially stacked. For the GaN-based LED epitaxial structure and the preparation method thereof, the non-doped GaN buffer layer with the sandwich structure consisting of the GaN layer, the AlGaN layer and the GaN layer is used as a buffer layer, the buffer layer changes light scattering directions by using materials with different refractive indexes and thus the luminous efficiency can be improved.

21 Claims, 4 Drawing Sheets

(51) Int. Cl.
  *H01L 33/06* (2010.01)
  *H01L 21/02* (2006.01)
  *H01L 33/00* (2010.01)
  *H01L 33/04* (2010.01)
  *H01L 33/14* (2010.01)

(52) U.S. Cl.
  CPC ........ H01L 33/007 (2013.01); H01L 33/0075 (2013.01); H01L 33/04 (2013.01); H01L 33/12 (2013.01); H01L 33/32 (2013.01); *H01L 33/145* (2013.01)

(56) References Cited

U.S. PATENT DOCUMENTS

| | | | |
|---|---|---|---|
| 2002/0079502 A1* | 6/2002 | Ishibashi | B82Y 20/00 257/89 |
| 2002/0175337 A1* | 11/2002 | Chen | H01L 21/0242 257/90 |
| 2003/0006418 A1* | 1/2003 | Emerson | H01L 21/0237 257/79 |
| 2003/0045103 A1* | 3/2003 | Suzuki | C30B 25/02 438/689 |
| 2004/0195562 A1* | 10/2004 | Munns | H01L 29/155 257/1 |
| 2005/0214992 A1* | 9/2005 | Chakraborty | H01L 21/02378 438/172 |
| 2006/0175600 A1* | 8/2006 | Sato | B82Y 20/00 257/14 |
| 2008/0164489 A1* | 7/2008 | Schmidt | B82Y 20/00 257/102 |
| 2009/0057694 A1* | 3/2009 | Tsai | H01L 33/12 257/94 |
| 2009/0072262 A1* | 3/2009 | Iza | H01L 33/04 257/98 |
| 2009/0310640 A1* | 12/2009 | Sato | H01L 21/02389 372/45.011 |
| 2010/0065812 A1* | 3/2010 | Nakahara | H01L 33/04 257/13 |
| 2010/0133506 A1* | 6/2010 | Nakanishi | B82Y 20/00 257/13 |
| 2010/0219445 A1* | 9/2010 | Yokoyama | H01L 33/025 257/101 |
| 2011/0198583 A1* | 8/2011 | Nago | B82Y 20/00 257/43 |
| 2011/0215351 A1* | 9/2011 | Kimura | B82Y 20/00 257/94 |
| 2012/0037881 A1* | 2/2012 | Kim | H01L 33/007 257/13 |
| 2013/0056785 A1* | 3/2013 | Hwang | H01L 27/15 257/99 |
| 2013/0069033 A1* | 3/2013 | Kushibe | H01L 33/06 257/13 |
| 2013/0248818 A1* | 9/2013 | Choi | H01L 33/0062 257/13 |
| 2014/0077239 A1* | 3/2014 | Hung | H01L 21/02458 257/94 |
| 2014/0252366 A1* | 9/2014 | Gao | H01L 29/2003 257/76 |
| 2014/0361247 A1* | 12/2014 | Choi | H01L 33/06 257/13 |
| 2015/0318448 A1* | 11/2015 | Nan | H01L 33/44 257/13 |
| 2015/0357419 A1* | 12/2015 | Lutgen | H01L 21/0254 257/22 |

* cited by examiner

GAN-BASED LED EPITAXIAL STRUCTURE AND PREPARATION METHOD THEREOF

BACKGROUND OF THE PRESENT INVENTION

Field of Invention

The present invention belongs to the field of semiconductor illumination and in particular relates to a GaN-based LED epitaxial structure and a preparation method thereof.

Description of Related Arts

Due to the advantages of long service life, low energy consumption and the like, LED (Light Emitting Diode) has been widely applied to various fields. Especially with the increasing great improvement of the illumination performance index thereof, LED is usually used as a light emitting device in the field of illumination. III-V family compound semiconductors represented by gallium nitride (GaN), especially InGaN/GaN-based (indium gallium nitride/gallium nitride) LEDs have a huge application potential in the field of photoelectronic devices such as high-brightness blue light emitting diodes and blue light lasers due to the features such as wide band gap, high luminous efficiency, high electron saturation drift velocity and stable chemical property, and are widely concerned by people.

However, since an InGaN/GaN structure has the problem of very great lattice and thermal expansion coefficient mismatches, consequently a polarized electric field exists in a quantum well. This polarized electric field easily causes the quantum well to be inclined. As a result, electron and hole wave functions in the quantum well are spatially separated and thereby recombination efficiency of electrons and holes is decreased. Although the luminous efficiency of the current InGaN/GaN LEDs has already been obviously improved, for high-power GaN-based LEDs, the problem of serious quantum efficiency droop still exists and the inner quantum efficiency of the LEDs is quickly drooped even under the situation of large current injection. In addition, leakage of electrons towards a P end is one of reasons which cause low efficiency.

The above-mentioned problems are mainly caused by the existence of the polarized electric field in a well due to the lattice mismatch of the InGaN/GaN quantum well structure, the existence of the polarized electric field causes electron and hole wave functions in the quantum well to be spatially separated and thereby the recombination efficiency of electrons and holes is decreased. Therefore, in order to decrease the negative effect of the built-in polarized electric field, the prior art usually adopts InGaN, ALINGAN and the like to decrease the mismatch between potential barriers and potential wells; and there are people who put forward a method of realizing lattice mismatch decrease by gradually changing indium components in the potential wells. However, since indium atoms are easily volatilized from epitaxial materials under the condition of heating, it is very difficult to realize the above-mentioned methods according to set values.

In view of the above-mentioned defects of the prior art, it is really necessary to provide a GaN-based LED epitaxial structure and a preparation method which have the advantages that the distribution of electrons in each luminous well can be enabled to be more uniform, the leakage of the electrons towards the P end can be reduced and thus the luminous efficiency of the quantum well can be improved.

SUMMARY OF THE PRESENT INVENTION

In view of the above-mentioned disadvantages existing in the prior art, an object of the present invention is to provide a GaN-based LED epitaxial structure and a preparation method thereof, which are used for solving the problem that the luminous efficiency of the GaN-based luminous epitaxial structure is caused to be comparatively low due to non-uniform distribution of electrons in luminous quantum wells and leakage of electrons towards a P end in the prior art.

In order to realize the above-mentioned object and other related objects, the present invention provides a preparation method of a GaN-based LED epitaxial structure, which comprises the following steps:

step 1): providing a growth substrate and growing a non-doped GaN buffer layer consisting of a GaN layer, an AlGaN layer and a GaN layer which are sequentially stacked on the growth substrate;

step 2): sequentially growing an undoped GaN layer and an N-type GaN layer on the non-doped GaN buffer layer;

step 3): growing an InGaN/GaN superlattice quantum well structure on the N-type GaN layer;

step 4): growing a multiple quantum well luminous layer structure on the InGaN/GaN superlattice quantum well structure;

step 5): sequentially growing an AlGaN layer, a low-temperature P-type layer and a P-type electron blocking layer on the multiple quantum well luminous layer structure; and step 6): growing a P-type GaN layer on the P-type electron blocking layer.

As a preferred solution of the preparation method of the GaN-based LED epitaxial structure provided by the present invention, in step 1), a growth temperature range of the non-doped GaN buffer layer is 450-650° C. and a total growth thickness range is 15-50 nm.

As a preferred solution of the preparation method of the GaN-based LED epitaxial structure provided by the present invention, in step 1), the thickness of the GaN layer, the AlGaN layer and the GaN layer in the non-doped GaN buffer layer is all the same, the thickness of any two layers is the same or the thickness of all three layers is all different.

As a preferred solution of the preparation method of the GaN-based LED epitaxial structure provided by the present invention, in step 2), a growth temperature range of the undoped GaN layer and the N-type GaN layer is 1000-1200° C., a total growth thickness range is 1.5-4.5 μm, and an Si doping concentration range in the N-type GaN layer is 1e18-3e19.

As a preferred solution of the preparation method of the GaN-based LED epitaxial structure provided by the present invention, in step 3), a growth temperature range of the InGaN/GaN superlattice quantum well structure is 700-900° C.

As a preferred solution of the preparation method of the GaN-based LED epitaxial structure provided by the present invention, in step 3), a number range of cycle logarithms in the InGaN/GaN superlattice quantum well structure is 3-30, an atomic ratio range of an In component in an InGaN potential well is 1-5%, a thickness range of the InGaN potential well is 1.0-4.0 nm and a thickness range of a GaN potential barrier is 1.0-9.0 nm.

As a preferred solution of the preparation method of the GaN-based LED epitaxial structure provided by the present invention, in step 4), a growth temperature range of the multiple quantum well luminous layer structure is 700-900° C.

As a preferred solution of the preparation method of the GaN-based LED epitaxial structure provided by the present invention, in step 4), a number range of potential barrier-potential well cycle logarithms contained in the multiple quantum well luminous layer structure is 5-18, an atomic ratio range of an In component in an InGaN potential well is 15-20%, a thickness range of the InGaN potential well is 2.0-4.0 nm and a thickness range of a GaN potential barrier is 3-15 nm.

As a preferred solution of the preparation method of the GaN-based LED epitaxial structure provided by the present invention, growing the InGaN potential well in step 4) comprises the following steps:

step 4-1): turning on a Ga source and growing InGaN, wherein a feed amount of TMIn is 100-300 sccm;

step 4-2): turning off the Ga source, changing the feed amount of TMIn to be 3-5 times of the feed amount in Step 4-1) and turning off TMIn after predetermined feed time; and step 4-3): turning on the Ga source and continuously growing InGaN, wherein the feed amount of TMIn is 100-300 sccm and the total thickness of the InGaN potential well after growth is 2.0-4.0 nm.

As a preferred solution of the preparation method of the GaN-based LED epitaxial structure provided by the present invention, in step 5), an atomic ratio range of an Al component in the AlGaN layer is 2-20% and a thickness range of the AlGaN layer is 20-35 nm.

As a preferred solution of the preparation method of the GaN-based LED epitaxial structure provided by the present invention, in step 5), the P-type electron blocking layer comprises one of P-type AlGaN, P-type AlInGaN and P-type AlGaN/GaN superlattice structures, a total thickness range of the P-type electron blocking layer is 30-80 nm and an Mg doping concentration range in the P-type electron blocking layer is 5e18-3.5e19.

As a preferred solution of the preparation method of the GaN-based LED epitaxial structure provided by the present invention, in step 6), an Mg doping concentration range in the P-type GaN layer is 5e18-1e20 and a thickness range of the P-type GaN layer is 30-150 nm.

The present invention further provides a GaN-based LED epitaxial structure. The GaN-based LED epitaxial structure comprises a non-doped GaN buffer layer, an undoped GaN layer, an N-type GaN layer, an InGaN/GaN superlattice quantum well structure, a multiple quantum well luminous layer structure, an AlGaN layer, a low-temperature P-type layer, a P-type electron blocking layer and a P-type GaN layer which are sequentially stacked, wherein the non-doped GaN buffer layer comprises a sandwich structure consisting of a GaN layer, an AlGaN layer and a GaN layer which are sequentially stacked.

As a preferred solution of the GaN-based LED epitaxial structure provided by the present invention, the GaN-based LED epitaxial structure is formed on a growth substrate comprising one of sapphire, GaN, silicon and silicon carbide.

As a preferred solution of the GaN-based LED epitaxial structure provided by the present invention, a total thickness range of the non-doped GaN buffer layer is 15-50 nm.

As a preferred solution of the GaN-based LED epitaxial structure provided by the present invention, the thickness of the GaN layer, the AlGaN layer and the GaN layer in the non-doped GaN buffer layer is all the same, the thickness of any two layers is the same or the thickness of all three layers is all different.

As a preferred solution of the GaN-based LED epitaxial structure provided by the present invention, a total growth thickness range of the undoped GaN layer and the N-type GaN layer is 1.5-4.5 um, and an Si doping concentration range in the N-type GaN layer is 1e18-3e19.

As a preferred solution of the GaN-based LED epitaxial structure provided by the present invention, a number range of cycle logarithms in the InGaN/GaN superlattice quantum well structure is 3-30, an atomic ratio range of an In component in an InGaN potential well is 1-5%, a thickness range of the InGaN potential well is 1.0-4.0 nm and a thickness range of a GaN potential barrier is 1.0-9.0 nm.

As a preferred solution of the GaN-based LED epitaxial structure provided by the present invention, a number range of potential barrier-potential well cycle logarithms contained in the multiple quantum well luminous layer structure is 5-18, an atomic ratio range of an In component in an InGaN potential well is 15-20%, a thickness range of the InGaN potential well is 2.0-4.0 nm and a thickness range of a GaN potential barrier is 3-15 nm.

As a preferred solution of the GaN-based LED epitaxial structure provided by the present invention, an atomic ratio range of an Al component in the AlGaN layer is 2-20% and a thickness range of the AlGaN layer is 20-35 nm.

As a preferred solution of the GaN-based LED epitaxial structure provided by the present invention, the P-type electron blocking layer comprises one of P-type AlGaN, P-type AlInGaN and P-type AlGaN/GaN superlattice structures, a total thickness range of the P-type electron blocking layer is 30-80 nm and an Mg doping concentration range in the P-type electron blocking layer is 5e18-3.5e19.

As a preferred solution of the GaN-based LED epitaxial structure provided by the present invention, an Mg doping concentration range in the P-type GaN layer is 5e18-1e20 and a thickness range of the P-type GaN layer is 30-150 nm.

As described above, the prevent invention provides a GaN-based LED epitaxial structure and a preparation method thereof, wherein the epitaxial structure comprises a non-doped GaN buffer layer, an undoped GaN layer, an N-type GaN layer, an InGaN/GaN superlattice quantum well structure, a multiple quantum well luminous layer structure, an AlGaN layer, a low-temperature P-type layer, a P-type electron blocking layer and a P-type GaN layer which are sequentially stacked, wherein the non-doped GaN buffer layer comprises a sandwich structure consisting of a GaN layer, an AlGaN layer and a GaN layer which are sequentially stacked. The present invention provides the GaN-based LED epitaxial structure that enables to improve luminous efficiency and the preparation method thereof, specifically the non-doped GaN buffer layer with the sandwich structure consisting of the GaN layer, the AlGaN layer and the GaN layer is used as a buffer layer, which changes light scattering directions by using materials with different refractive indexes and thus the luminous efficiency can be improved.

BRIEF DESCRIPTION OF THE DRAWINGS

FIG. 2a to FIG. 7 respectively illustrate a structural schematic view presented by each step of the preparation method of the GaN-based LED epitaxial structure of the present invention, wherein FIG. 2b illustrates a structural schematic view of a non-doped GaN buffer layer in the GaN-based LED epitaxial structure of the present invention and FIG. 7 illustrates a structural schematic view of the GaN-based LED epitaxial structure of the present invention.

DESCRIPTION OF COMPONENT REFERENCE SIGNS

10 Growth substrate
11 Non-doped GaN buffer layer

111 GaN layer
112 AlGaN layer
113 GaN layer
12 Undoped GaN layer
13 N-type GaN layer
14 InGaN/GaN superlattice quantum well structure
15 Multiple quantum well luminous layer structure
16 AlGaN layer
17 Low-temperature P-type layer
18 P-type electron blocking layer
19 P-type GaN layer
S11-S16 Step 1)-step 6)

DETAILED DESCRIPTION OF THE PREFERRED EMBODIMENTS

The embodiments of the present invention will be described below through specific examples. One skilled in the art can easily understand other advantages and effects of the present invention according to the contents disclosed by the description. The present invention can also be implemented or applied through other different specific embodiments. Various modifications or variations can be made to all details in the description based on different points of view and applications without departing from the spirit of the present invention.

Please refer to FIG. 1 to FIG. 7. It needs to be noted that the drawings provided in tins embodiment are just used for exemplarily describing the basic concept of the present invention, thus the drawings only show components related to the present invention but are not drawn according to component numbers, shapes and sizes during actual implementation, the patterns, numbers and proportions of all components can be randomly changed during actual implementation, and the component layout patterns can also be more complex.

Embodiment 1

Figure 1:
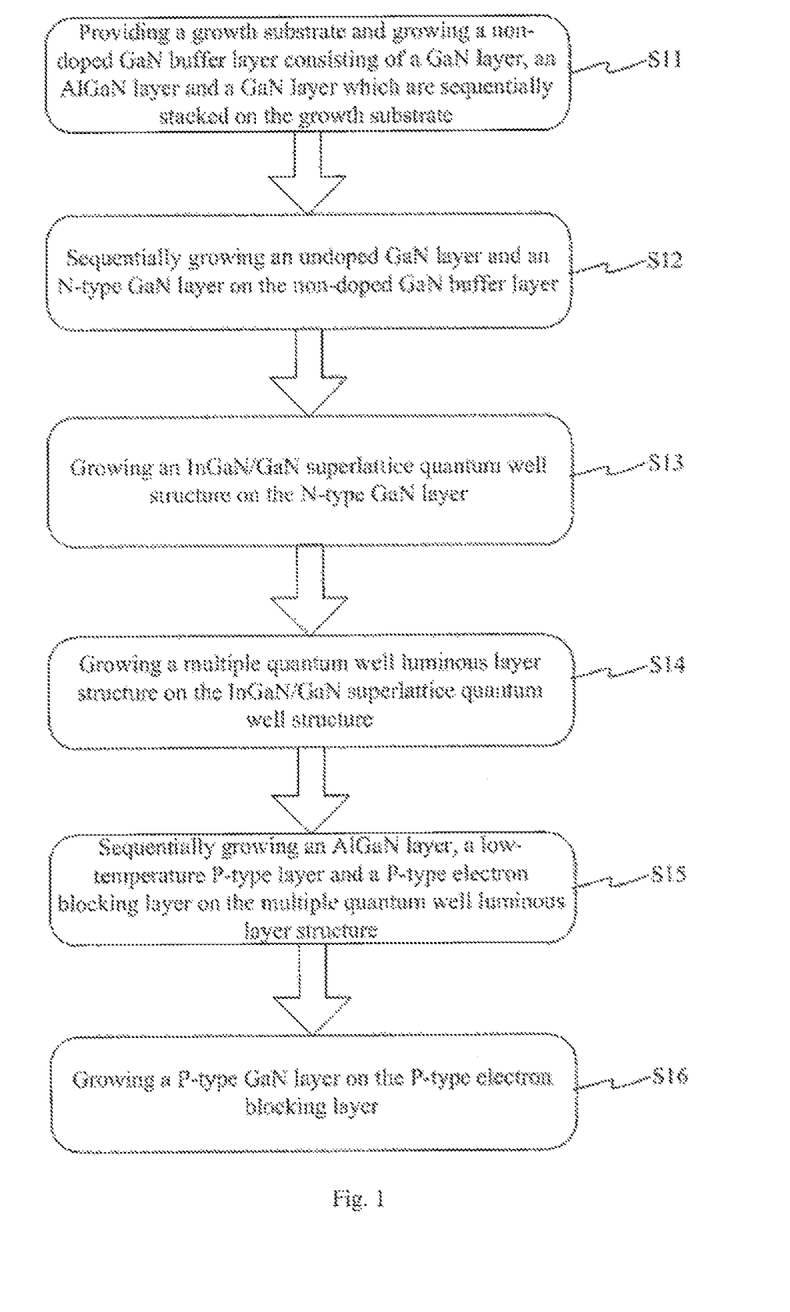
FIG. 1 illustrates a flowchart of steps of a preparation method of a GaN-based LED epitaxial structure of the present invention.
Figure 2A:
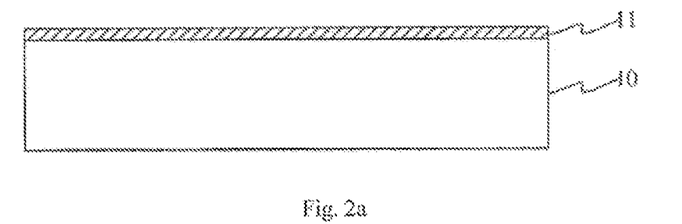
Figure 2B:
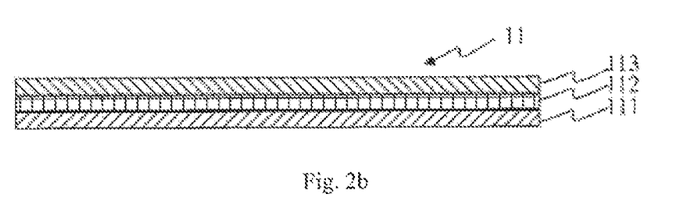

As shown in FIG. 1 to FIG. 7, this embodiment provides a preparation method of a GaN-based LED epitaxial structure, the preparation method comprises the following steps:

As shown in FIG. 1 and FIG. 2a to FIG. 2b, firstly perform step 1), i.e., S11: providing a growth substrate 10 and growing a non-doped GaN buffer layer 11 consisting of a GaN layer 111, an AlGaN layer 112 and a GaN layer 113 which are sequentially stacked on the growth substrate 10.

As an example, the growth substrate 10 can be sapphire, GaN, silicon, silicon carbide and the like. In this embodiment, the growth substrate 10 is a sapphire substrate.

As an example, growth temperature of the non-doped GaN buffer layer is comparatively low, a range of the growth temperature is 450-650° C. and a total growth thickness range is 15-50 nm. In this embodiment, the growth temperature of the non-doped GaN buffer layer is 400° C. and the total growth thickness is 30 nm.

As an example, the thickness of the GaN layer 111, the AlGaN layer 112 and the GaN layer 113 in the non-doped GaN buffer layer 11 is all the same, the thickness of any two layers is the same or the thickness of all three layers is all different. In this embodiment, by controlling growth time, the thickness of the GaN layer 111, the AlGaN layer 112 and the GaN layer 113 in the non-doped GaN buffer layer 11 is enabled to be all the same.

Figure 3:
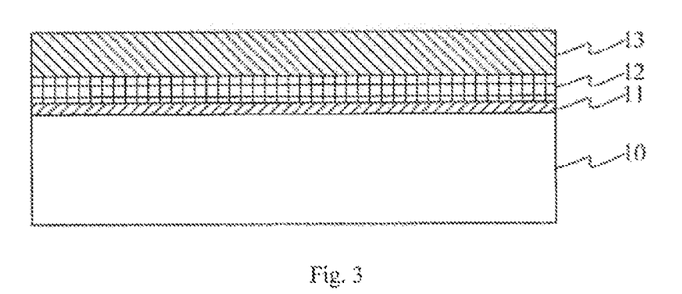
Figure 5:
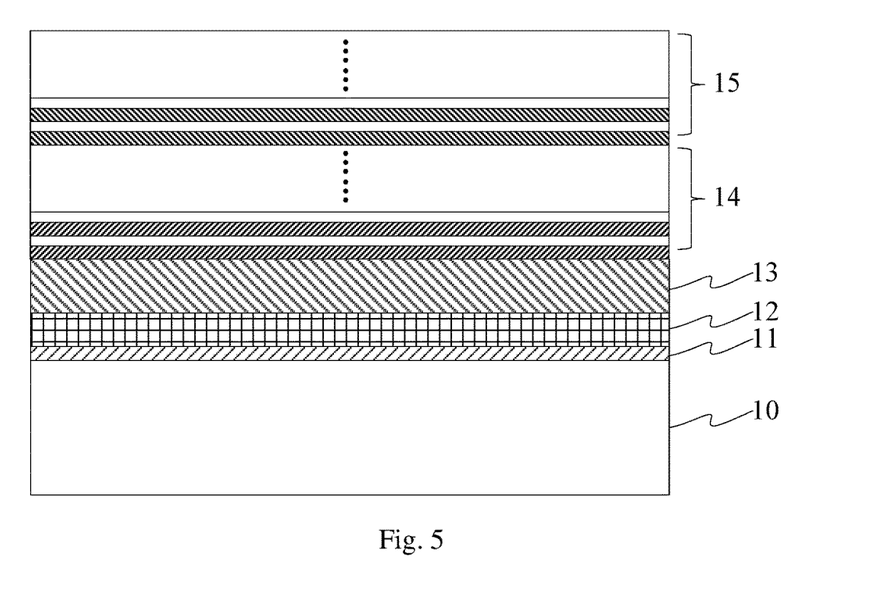

As shown in FIG. 5 and FIG. 3, then perform step 2), i.e., S12: sequentially growing an undoped GaN layer 12 and an N-type GaN layer 13 on the non-doped GaN buffer layer 11.

Specifically, this step comprises the following sub-steps:
Step 2-1): growing an undoped GaN layer 12 on the non-doped GaN buffer layer at 1000-1200° C.;
Step 2-2): growing an N-type GaN layer 13 on an surface of the undoped GaN layer at 1000-1200° C., wherein an Si doping concentration range in the N-type GaN layer 13 is 1e18-3e19, and a total growth thickness range of the N-type GaN layer 13 and the undoped GaN layer 12 is 1.5-4.5 um after the growth of the N-type GaN layer 13.

Figure 4:
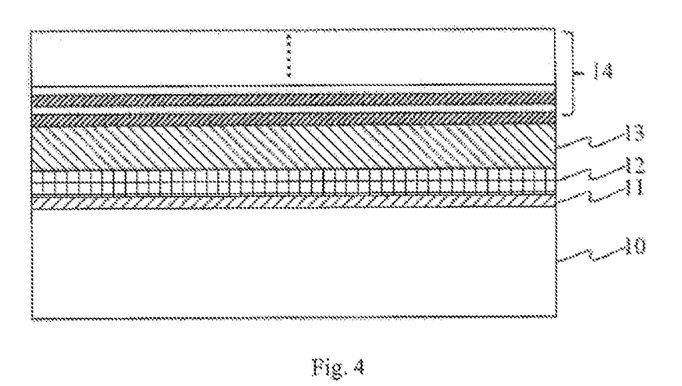

As shown in FIG. 1 and FIG. 4, then perform step 3), i.e., S13: growing an InGaN/GaN superlattice quantum well structure 14 on the N-type GaN layer 13.

As an example, a growth temperature range of the InGaN/GaN superlattice quantum well structure is 700-900° C. In this embodiment, the growth temperature of the InGaN/GaN superlattice quantum well structure is 800° C.

As an example, a number range of cycle logarithms in the InGaN/GaN superlattice quantum well structure 14 is 3-30, an atomic ratio range of an In component in an InGaN potential well is 1-5%, a thickness range of the InGaN potential well is 1.0-4.0 nm and a thickness range of a GaN potential barrier is 1.0-9.0 nm. In this embodiment, the number of cycle logarithms in the InGaN/GaN superlattice quantum well structure 14 is 10, the atomic ratio range of the In component in the InGaN potential well is 3%, the thickness of the InGaN potential well is 2.0 nm and the thickness of the GaN potential barrier is 4.0 nm.

As shown in FIG. 1 and FIG. 5, then perform step 4), i.e., S14: growing a multiple quantum well luminous layer structure 15 on the InGaN/GaN superlattice quantum well structure.

As an example, a growth temperature range of the multiple quantum well luminous layer structure 15 is 700-900° C.

As an example, a number range of potential barrier-potential well cycle logarithms contained in the multiple quantum well luminous layer structure 15 is 5-18, an atomic ratio range of an In component in an InGaN potential well is 15-20%, a thickness range of the InGaN potential well is 2.0-4.0 nm and a thickness range of a GaN potential barrier is 3-15 nm. In this embodiment, the number of the potential barrier-potential well cycle logarithms contained in the multiple quantum well luminous layer structure 15 is 10, the atomic ratio of the In component in the InGaN potential well is 15%, the thickness of the InGaN potential well is 3.0 nm and the thickness of the GaN potential barrier is 6 nm.

In this embodiment, growing an InGaN potential well of the multiple quantum well luminous layer structure 15 comprises the following steps:

step 4-1): turning on a Ga source and growing InGaN, wherein a feed amount of TMIn is 100-300 sccm;

step 4-2): turning off the Ga source, changing the feed amount of TMIn to be 3-5 times of the feed amount in step 4-1) and turning off TMIn after predetermined feed time; and step 4-3): turning on the Ga source and continuously growing InGaN, wherein the feed amount of TMIn is 100-300 sccm and the total thickness of the InGaN potential well after growth is 2.0-4.0 nm.

Figure 6:
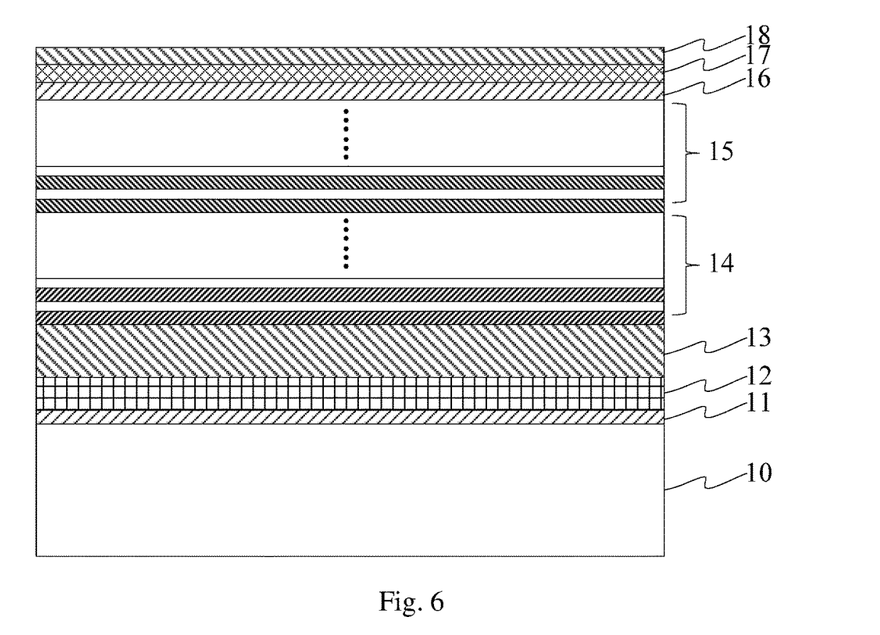

As shown in FIG. 1 and FIG. 6, then perform step 5), i.e., S15: sequentially growing an AlGaN layer 16, a low-temperature P-type layer 17 and a P-type electron blocking layer 18 on the multiple quantum well luminous layer structure 15.

As an example, an atomic ratio range of an Al component in the AlGaN layer 16 is 2-20% and a thickness range of the AlGaN layer 16 is 20-35 nm. In this embodiment, the atomic ratio of the Al component in the AlGaN layer 16 is 10% and the thickness of the AlGaN layer 16 is 25 nm.

As an example, a growth temperature range of the low-temperature P-type layer 17 is 700-800° C.

As an example, the P-type electron blocking layer 18 comprises one of P-type AlGaN, P-type AlInGaN and P-type AlGaN/GaN superlattice structures, a total thickness range of the P-type electron blocking layer 18 is 30-80 nm and an Mg doping concentration range in the P-type electron blocking layer 18 is 5e18-3.5e19. In this embodiment, the P-type electron blocking layer 18 is P-type AlGaN, the total thickness of the P-type electron blocking layer 18 is 50 nm and the Mg doping concentration in the P-type electron blocking layer 18 is 1e19.

Figure 7:
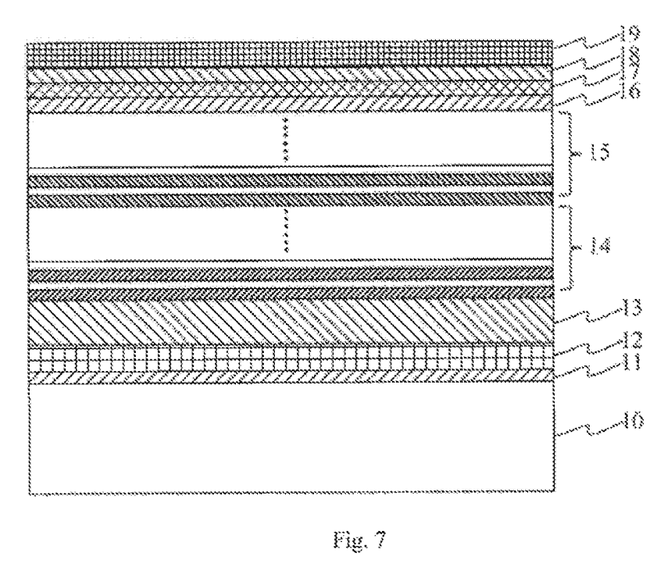

As shown in FIG. 1 and FIG. 7, finally perform step 6), i.e., S16: growing a P-type GaN layer 19 on the P-type electron blocking layer 18.

As an example, an Mg doping concentration range in the P-type GaN layer 19 is 5e18-1e20 and a thickness range of the P-type GaN layer 19 is 30-150 nm. In this embodiment, the Mg doping concentration in the P-type GaN layer 19 is 1e19 and the thickness of the P-type GaN layer 19 is 100 nm.

As described above, in this embodiment, the non-doped GaN buffer layer with the sandwich structure consisting of the GaN layer, the AlGaN layer and the GaN layer is used as a buffer layer, the buffer layer changes light scattering directions by using materials with different refractive indexes and thus the luminous efficiency can be improved.

Embodiment 2

As shown in FIG. 7, this embodiment provides a GaN-based LED epitaxial structure. The epitaxial structure comprises a non-doped GaN buffer layer 11, an undoped GaN layer 12, an N-type GaN layer 13, an InGaN/GaN superlattice quantum well structure 14, a multiple quantum well luminous layer structure 15, an AlGaN layer 16, a low-temperature P-type layer 17, a P-type electron blocking layer 18 and a P-type GaN layer 19 which are sequentially stacked, wherein the non-doped GaN buffer layer 11 comprises a sandwich structure consisting of a GaN layer 111, an AlGaN layer 112 and a GaN layer 113 which are sequentially stacked.

As shown in FIG. 7, the GaN-based LED epitaxial structure is formed on a growth substrate 10 comprising one of sapphire, GaN, silicon and silicon carbide. In this embodiment, the GaN-based LED epitaxial structure is formed on a sapphire substrate.

As shown in FIG. 7, a total thickness range of the non-doped GaN buffer layer is 15-50 nm. In this embodiment, the total thickness of the non-doped GaN buffer layer is 30 nm.

As an example, the thickness of the GaN layer 111, the AlGaN layer 112 and the GaN layer 113 in the non-doped GaN buffer layer 11 is all the same, the thickness of any two layers is the same or the thickness of all three layers is all different. In this embodiment, the thickness of the GaN layer 111, the AlGaN layer 112 and the GaN layer 113 in the non-doped GaN buffer layer 11 is all the same.

As shown in FIG. 7, a total growth thickness range of the undoped GaN layer 12 and the N-type GaN layer 13 is 1.5-4.5 um, and an Si doping concentration range in the N-type GaN layer 13 is 1e18-3e19.

As shown in FIG. 7, a number range of cycle logarithms in the InGaN/GaN superlattice quantum well structure 14 is 3-30, an atomic ratio range of an In component in an InGaN potential well is 1-5%, a thickness range of the InGaN potential well is 1.0-4.0 nm and a thickness range of a GaN potential barrier is 1.0-9.0 nm. In this embodiment, the number of cycle logarithms in the InGaN/GaN superlattice quantum well structure 14 is 10, the atomic ratio of the In component in the InGaN potential well is 3%, the thickness of the InGaN potential well is 2.0 nm and the thickness of the GaN potential barrier is 4.0 nm.

As shown in FIG. 7, a number range of potential barrier-potential well cycle logarithms contained in the multiple quantum well luminous layer structure 15 is 5-18, an atomic ratio range of an In component in the InGaN potential well is 15-20%, a thickness range of the InGaN potential well is 2.0-4.0 nm and a thickness range of the GaN potential barrier is 3-15 nm. In this embodiment the number of potential barrier-potential well cycle logarithms contained in the multiple quantum well luminous layer structure 15 is 10, the atomic ratio of the In component in the InGaN potential well is 15%, the thickness of the InGaN potential well is 3.0 nm and the thickness of the GaN potential barrier is 6 nm.

As shown in FIG. 7, an atomic ratio range of an Al component in the AlGaN layer 16 is 2-20% and a thickness range of the AlGaN layer 16 is 20-35 nm. In this embodiment, the atomic ratio of the Al component in the AlGaN layer 16 is 10% and the thickness of the AlGaN layer 16 is 25 nm.

As shown in FIG. 7, the P-type electron blocking layer 18 comprises one of P-type AlGaN, P-type AlInGaN and P-type AlGaN/GaN superlattice structures, a total thickness range of the P-type electron blocking layer 18 is 30-80 nm and an Mg doping concentration range in the P-type electron blocking layer 18 is 5e18-3.5e19. In this embodiment, the P-type electron blocking layer 18 is the P-type AlGaN, the total thickness of the P-type electron blocking layer 18 is 50 nm and the Mg doping concentration in the P-type electron blocking layer 18 is 1e19.

As shown in FIG. 7, an Mg doping concentration range in the P-type GaN layer 19 is 5e18-1e20 and a thickness range of the P-type GaN layer 19 is 30-150 nm. In this embodiment, the Mg doping concentration in the P-type GaN layer 19 is 1e19 and the thickness of the P-type GaN layer 19 is 100 nm.

In this embodiment, the non-doped GaN buffer layer with the sandwich structure consisting of the GaN layer, the AlGaN layer and the GaN layer is used as a buffer layer, the buffer layer changes light scattering directions by using materials with different refractive indexes and thus the luminous efficiency can be improved.

As described above, the present invention provides a GaN-based LED epitaxial structure and a preparation method thereof, wherein the epitaxial structure comprises a non-doped GaN buffer layer, an undoped GaN layer, an N-type GaN layer, an InGaN/GaN superlattice quantum well structure, a multiple quantum well luminous layer structure, an AlGaN layer, a low-temperature P-type layer, a P-type electron blocking layer and a P-type GaN layer which are sequentially stacked, wherein the non-doped GaN buffer layer comprises a sandwich structure consisting of a GaN layer, an AlGaN layer and a GaN layer which are sequentially stacked. The present invention provides the GaN-based LED epitaxial structure that enables to improve luminous efficiency and the preparation method thereof, specifically the non-doped GaN buffer layer with the sandwich structure consisting of the GaN layer, the AlGaN layer and the GaN layer is used as a buffer layer, the buffer layer changes light scattering directions by using materials with different refractive indexes and thus the luminous efficiency can be improved. Therefore, the present invention effectively overcomes all kinds of disadvantages in the prior art and has a great industrial utilization value.

The above-mentioned embodiments are just used for exemplarily describing the principle and effect of the present invention instead of limiting the present invention. One skilled in the art can make modifications or variations to the above-mentioned embodiments without departing from the spirit and the range of the present invention. Therefore, all equivalent modifications or variations made by those who have common knowledge in the art without departing from the spirit and technical concept disclosed by the present invention shall be still covered by the claims of the present invention.

What is claimed is:

1. A preparation method of a GaN-based LED epitaxial structure, comprising steps of:
    step 1): providing a growth substrate and growing a non-doped GaN buffer layer, wherein the non-doped GaN buffer layer consists of a GaN layer, an AlGaN layer and a GaN layer which are sequentially stacked on the growth substrate; wherein a growth temperature range of the non-doped GaN buffer layer is 450-650° C. and a total growth thickness range thereof is 15-50 nm;
    step 2): sequentially growing an undoped GaN layer and an N-type GaN layer on the non-doped GaN buffer layer; wherein a growth temperature range of the undoped GaN layer and the N-type GaN layer is 1000-1200° C., a total growth thickness range thereof is 1.5-4.5 μm, and an Si doping concentration range in the N-type GaN layer is 1e18-3e19;
    step 3): growing an InGaN/GaN superlattice quantum well structure on the N-type GaN layer;
    step 4): growing a multiple quantum well luminous layer structure on the InGaN/GaN superlattice quantum well structure;
    step 5): sequentially growing an AlGaN layer, a low-temperature P-type layer and a P-type electron blocking layer on the multiple quantum well luminous layer structure; and
    step 6): growing a P-type GaN layer on the P-type electron blocking layer.

2. The preparation method of claim 1, wherein in step 1), the thickness of the GaN layer, the AlGaN layer and the GaN layer in the non-doped GaN buffer layer is all the same, the thickness of any two layers is the same or the thickness of all three layers is all different.

3. The preparation method of claim 1, wherein in step 3), a growth temperature range of the InGaN/GaN superlattice quantum well structure is 700-900° C.

4. The preparation method of claim 1, wherein in step 3), a number range of cycle logarithms in the InGaN/GaN superlattice quantum well structure is 3-30, an atomic ratio range of an In component in an InGaN potential well is 1-5%, a thickness range of the InGaN potential well is 1.0-4.0 nm and a thickness range of a GaN potential barrier is 1.0-9.0 nm.

5. The preparation method of claim 1, wherein in step 4), a growth temperature range of the multiple quantum well luminous layer structure is 700-900° C.

6. The preparation method of claim 1, wherein in step 4), a number range of potential barrier-potential well cycle logarithms contained in the multiple quantum well luminous layer structure is 5-18, an atomic ratio range of an In component in an InGaN potential well is 15-20%, a thickness range of the InGaN potential well is 2.0-4.0 nm and a thickness range of a GaN potential barrier is 3-15 nm.

7. The preparation method of claim 1, wherein in step 4), growing an InGaN potential well comprises steps of:
    step 4-1): turning on a Ga source and growing InGaN, wherein a feed amount of TMIn is 100-300 sccm;
    step 4-2): turning off the Ga source, changing the feed amount of TMIn to be 3-5 times of the feed amount in step 4-1) and turning off TMIn after predetermined feed time; and
    step 4-3): turning on the Ga source and continuously growing InGaN, wherein the feed amount of TMIn is 100-300 sccm and the total thickness of the InGaN potential well after growth is 2.0-4.0 nm.

8. The preparation method of claim 1, wherein in step 5), an atomic ratio range of an Al component in the AlGaN layer is 2-20% and a thickness range of the AlGaN layer is 20-35 nm.

9. The preparation method of claim 1, wherein in step 5), the P-type electron blocking layer comprises one of P-type AlGaN, P-type AlInGaN and P-type AlGaN/GaN superlattice structures, a total thickness range of the P-type electron blocking layer is 30-80 nm and an Mg doping concentration range in the P-type electron blocking layer is 5e18-3.5e19.

10. The preparation method of claim 1, wherein in step 6), an Mg doping concentration range in the P-type GaN layer is 5e18-1e20 and a thickness range of the P-type GaN layer is 30-150 nm.

11. A GaN-based LED epitaxial structure, comprising a non-doped GaN buffer layer, an undoped GaN layer, an N-type GaN layer, an InGaN/GaN superlattice quantum well structure, a multiple quantum well luminous layer structure, an AlGaN layer, a low-temperature P-type layer, a P-type electron blocking layer and a P-type GaN layer which are sequentially stacked, wherein the non-doped GaN buffer layer comprises a sandwich structure consisting of a GaN layer, an AlGaN layer and a GaN layer which are sequentially stacked.

12. The GaN-based LED epitaxial structure of claim 11, wherein the GaN-based LED epitaxial structure is formed on a growth substrate comprising one of sapphire, GaN, silicon and silicon carbide.

13. The GaN-based LED epitaxial structure of claim 11, wherein a total thickness range of the non-doped GaN buffer layer is 15-50 nm.

14. The GaN-based LED epitaxial structure of claim 11, wherein the thickness of the GaN layer, the AlGaN layer and the GaN layer in the non-doped GaN buffer layer is all the same, the thickness of any two layers is the same or the thickness of all three layers is all different.

15. The GaN-based LED epitaxial structure of claim 11, wherein a total growth thickness range of the undoped GaN layer and the N-type GaN layer is 1.5-4.5 um, and an Si doping concentration range in the N-type GaN layer is 1e18-3e19.

16. The GaN-based LED epitaxial structure of claim 11, wherein a number range of cycle logarithms in the InGaN/GaN superlattice quantum well structure is 3-30, an atomic ratio range of an In component in an InGaN potential well is 1-5%, a thickness range of the InGaN potential well is 1.0-4.0 nm and a thickness range of a GaN potential barrier is 1.0-9.0 nm.

17. The GaN-based LED epitaxial structure of claim 11, wherein a number range of potential barrier-potential well cycle logarithms contained in the multiple quantum well luminous layer structure is 5-18, an atomic ratio range of an In component in an InGaN potential well is 15-20%, a thickness range of the InGaN potential well is 2.0-4.0 nm and a thickness range of a GaN potential barrier is 3-15 nm.

18. The GaN-based LED epitaxial structure of claim 11, wherein an atomic ratio range of an Al component in the AlGaN layer is 2-20% and a thickness range of the AlGaN layer is 20-35 nm.

19. The GaN-based LED epitaxial structure of claim 11, wherein the P-type electron blocking layer comprises one of P-type AlGaN, P-type AlInGaN and P-type AlGaN/GaN superlattice structures, a total thickness range of the P-type electron blocking layer is 30-80 nm and an Mg doping concentration range in the P-type electron blocking layer is 5e18-3.5e19.

20. The GaN-based LED epitaxial structure of claim 11, wherein an Mg doping concentration range in the P-type GaN layer is 5e18-1e20 and a thickness range of the P-type GaN layer is 30-150 nm.

21. The GaN-based LED epitaxial structure of claim 11, wherein the non-doped GaN buffer layer is the sandwich structure consisting of a GaN layer, an AlGaN layer and a GaN layer which are sequentially stacked.

* * * * *